(12) United States Patent
Keene et al.

(10) Patent No.: US 11,378,712 B2
(45) Date of Patent: Jul. 5, 2022

(54) MAGNETIC APPARATUS FOR PROTECTING A PROTECTED AREA

(71) Applicant: Metrasens Limited, Malvern (GB)

(72) Inventors: Mark Keene, Malvern (GB); Paul A. Manning, Malvern (GB)

(73) Assignee: Metrasens Limited, Malvern (GB)

( * ) Notice: Subject to any disclaimer, the term of this patent is extended or adjusted under 35 U.S.C. 154(b) by 244 days.

(21) Appl. No.: 16/638,868

(22) PCT Filed: Aug. 14, 2018

(86) PCT No.: PCT/GB2018/052309
§ 371 (c)(1),
(2) Date: Feb. 13, 2020

(87) PCT Pub. No.: WO2019/034867
PCT Pub. Date: Feb. 21, 2019

(65) Prior Publication Data
US 2020/0363559 A1 Nov. 19, 2020

(30) Foreign Application Priority Data
Aug. 14, 2017 (GB) ..................................... 1713014

(51) Int. Cl.
*G06F 11/30* (2006.01)
*G01V 3/38* (2006.01)
(Continued)

(52) U.S. Cl.
CPC ........... *G01V 3/38* (2013.01); *G01R 33/0005* (2013.01); *G01V 3/08* (2013.01)

(58) Field of Classification Search
CPC ...................................................... G01V 3/38
See application file for complete search history.

(56) References Cited

U.S. PATENT DOCUMENTS

| 7,898,248 B2 | 3/2011 | Douglas, Jr. et al. |
| 2009/0327191 A1 | 12/2009 | Douglas, Jr. et al. |

FOREIGN PATENT DOCUMENTS

| WO | 2012022971 A2 | 2/2012 |
| WO | 2014064429 A2 | 5/2014 |

(Continued)

OTHER PUBLICATIONS

PCT Search Report and Written Opinion for Application No. PCT/GB2018/052309 dated Oct. 31, 2018, 13 pages.

*Primary Examiner* — Phuong Huynh
(74) *Attorney, Agent, or Firm* — Maine Cernota & Rardin (57) ABSTRACT

An apparatus for detecting a moving ferromagnetic target object in a protected area comprises a first magnetic sensor adapted to measure a magnetic field within a first localised volume of space defined by a first zone of sensitivity of the first magnetic sensor and to produce a corresponding first measurement signal, and a second magnetic sensor adapted to measure a magnetic field within a second localised volume of space defined by a second zone of sensitivity of the second magnetic sensor and to produce a corresponding second measurement signal. The two magnetic sensors are separated spatially by a baseline such that the overlap between the two zones of sensitivity defines both a protected zone and a non-protected zone. A signal processing circuit is arranged in communication with the two magnetic sensors and is configured to process each of the first and second measurements signals to produce a respective first intermediate signal and a second intermediate signal which are each independent of the value of any non-changing background magnetic field that may be present in each zone of sensitivity, the value of the first and second intermediate signals thereby being dependent on the magnetic field associated with a target object moving in each zone of sensitivity. The first and second intermediate signals are proportional to the (Continued)

absolute change in magnetic field generated by the movement of the target object. The signal processing circuit also processes the two intermediate signals to provide an output signal that has a value that is indicative of whether the target object that caused the magnetic field is in the protected zone or in the non-protected zone.

22 Claims, 6 Drawing Sheets

(51) Int. Cl.
     *G01R 33/00*       (2006.01)
     *G01V 3/08*       (2006.01)

(56) References Cited

FOREIGN PATENT DOCUMENTS

| WO | 2015071672 A2 | 5/2015 |
| WO | WO 2015071672 * | 5/2015 |
| WO | 2016097724 A1 | 6/2016 |

* cited by examiner

MAGNETIC APPARATUS FOR PROTECTING A PROTECTED AREA

RELATED APPLICATIONS

This application is a national phase application filed under 35 USC § 371 of PCT Application No. PCT/GB2018/052309 with an International filing date of Aug. 14, 2018, which claims priority of GB Patent Application 1713014.7 filed Aug. 14, 2017. Each of these applications is herein incorporated by reference in its entirety for all purposes.

FIELD OF THE INVENTION

This invention relates to an apparatus for use in protecting a protected area such as a doorway to a room that includes or leads to a magnetic resonance imagining (MRI) scanner. It in particular relates to the field of gradiometers and similar apparatus.

BACKGROUND OF THE INVENTION

Gradiometers have a wide range of applications but it is envisaged that the gradiometer of the invention may, in particular, be used for detecting the presence of ferromagnetic objects passing through a protected area such as the opening of a doorway into a room leading to a magnetic resonance imagining (MRI) scanner. Other uses include security applications, for instance in a prison environment where it is desirable to detect contraband items, or in general security for the detection of knives and weapons concealed about a person.

In GB 2 395 276, there is taught a ferromagnetic detection system (FMDS) that is able to detect ferromagnetic objects by providing a primary sensor means comprising first and second passive magnetic sensors that work as a gradiometer to detect the disturbances in the ambient magnetic field, which occur as the object moves through the field. The apparatus also includes a secondary non-magnetic sensor means, which detects movement of objects in the vicinity of the primary sensor means. If both the primary and secondary sensing means detect a moving object, an alarm is triggered. It is proposed in that patent that the apparatus may be mounted to the wall on either side of a doorway to a room containing a magnetic resonance imaging apparatus, with the secondary sensor means being arranged to detect objects approaching or about to pass through the doorway. Because both the primary and secondary sensors must detect the object, this arrangement helps to reduce false alarms.

The apparatus described above works very well to warn people who may be unintentionally about to take a ferromagnetic object into an MRI room. It is known that there have in the past been several unfortunate accidents that have occurred due to a ferrous object entering an MRI room and being magnetically propelled, at high velocity, into the MRI machine within the room. This is called the projectile effect and is well described in GB 2 395 276.

Magnetic gradiometers in FMDS such as the one described in the above referenced patent detect magnetic objects in all directions around them, i.e. they are omnidirectional and have no intrinsic directionality to 'look' across a doorway or other area to be protected and not in other directions. A typical gradiometer comprises two vector magnetic sensors oriented in the same direction and placed side by side or one above the other with the output being derived by subtracting the output of one sensor from the output of the other to determine the difference in the output signals produced by each magnetic sensor.

SUMMARY OF THE INVENTION

To alleviate this issue, the patent teaches the use of the non-magnetic second sensor to detect a person or object entering the protected area of the doorway. An alert is triggered by the coincidence of this with a magnetic detection. However, a common false-alert can occur when a non-magnetic person or object enters zone IV, the MRI scanner room, triggering the secondary sensor whilst the magnetic gradiometer is detecting something else such as a control room chair moving.

In the case of a patient screening FMDS, an unrelated magnetic object may be moving at the same time as a patient is being magnetically screened, again giving rise to a false positive alert. Where there are too many false positive alerts then staff can become 'alarm fatigued' and begin to ignore the alerts. This reduces the effectiveness of these systems.

In addition to the general need to have reduced false positive alerts in FMDS, it is desirable in many MRI facilities to have an FMDS well before the zone IV door and preferably at the zone II/III door, the control room area outside zone IV where the MRI technologists or radiographers work. Also, it is desirable for these to alert only for very large ferromagnetic objects that can cause major damage or injury. This FMDS should have a very low false positive alert rate.

FMDS are also employed in security applications. Portable, free-standing FMDS are now commonly used to detect contraband in prisons and in particular mobile phones and improvised weapons. They are also employed mounted to walls to screen for very small steel objects such as razor blades. They may also be used to guard a doorway in a similar manner to the medical application, but, without a low false alert rate and a more uniform sensing performance across the door, the utilization will be limited.

An object of the present invention in at least one of its aspects is to ameliorate some of the problems described hereinbefore.

According to a first aspect, the invention provides an apparatus for detecting a moving ferromagnetic target object in a protected zone comprising:
  a first magnetic sensor (S1) adapted to measure a magnetic field within a first localised volume of space defined by a first zone of sensitivity of the first magnetic sensor, and to produce a corresponding first measurement signal;
  a second magnetic sensor (S2) adapted to measure a magnetic field within a second localised volume of space defined by a second zone of sensitivity of the second magnetic sensor, and to produce a corresponding second measurement signal;
  the two magnetic sensors separated spatially by a baseline such that the overlap between the two zones of sensitivity defines both a protected zone and a non-protected zone; and
  a signal processing circuit arranged in communication with the two magnetic sensors;
  in which the signal processing circuit is configured to:
  a) process each of the first and second measurements signals to produce a respective first intermediate signal, $|\Delta B1|$, and second intermediate signal, $|\Delta B2|$, which are each independent of the value of any non-changing background magnetic field that may be present in each zone of sensitivity, the value of the first and second intermediate signals thereby being dependent on the magnetic field associated with a target object moving in each zone of sensitivity, the first and second intermediate signals being proportional to the absolute change in magnetic field generated by the movement of the target object; and b) process the two intermediate signals |ΔB1|, |ΔB2|, to provide an output signal that has a value that is indicative of whether the target object that caused the magnetic field is in the protected zone or in the non-protected zone.

Each magnetic sensor (S1, S2) may comprise a vector-type magnetic sensor or a scalar-type. They may each comprise one of the following: a fluxgate sensor, a magneto-resistive sensor, a magneto-impedance sensor, a Hall effect sensor, or a galvanic coil sensor, or a proton precession magnetometer which outputs a raw signal that is a measurement of the magnetic field incident upon the sensor.

The signal processing means may be arranged to indicate that the target object is in the protected zone or the non-protected zone according to the sign of the output signal.

The signal processing circuit may, for example, be configured to subtract the second intermediate signal (|ΔB2|) from the first intermediate signal (⊕ΔB1|). In this case, a negative value indicates that the target object is closer to the second sensor and hence in the non-protected zone and a positive value indicates that it is closer to the first sensor and hence in the protected zone.

The field upon a magnetic sensor S1 may be expressed as $B_0+\Delta B1$ where $B_0$ is the static background environmental or ambient field and $\Delta B1$ is the changing field associated with the target which may be positive or negative in sign. Similarly, sensor S2 senses $B_0+\Delta B2$. Unlike a traditional gradiometer which subtracts these to give $\Delta B1-\Delta B2$, i.e. it removes $B_0$ and outputs the difference in field the target cause the apparatus of this invention removes the ambient field $B_0$ from the outputs of S1 and S2 without subtracting between them to isolate $\Delta B1$ and $\Delta B2$ from $B_0$. As $\Delta B1$ and $\Delta B2$ can be of either sign the modulus is taken to force both to be a positive magnitude, referred to here as the intermediate signals (|ΔB1| and |ΔB2|). Because fields from targets always decay with distance irrespective of orientation, the sensor nearest the target always measures the strongest signal. In order to determine which sensor sees the strongest signal the intermediate signals need to be compared and the simplest means to do this is to subtract one from the other and observe the sign of the answer. The target is closest to the sensor with the largest intermediate signal. The apparatus configured according to this invention may be thought of as being directional if the largest intermediate signal is from the sensor nearest to the protected zone and zero otherwise.

The signal processing circuit may include a threshold detector, and the output signal that results from the subtraction may be passed through the threshold detector to provide a thresholded output signal that has two logical states, the state determining if the target object is in the protected zone or outside of the protected zone, the logical state depending on whether the value that results from the subtraction exceeds the threshold or not.

Use of the threshold detector reduces noise in the final output where very small changing magnetic fields are detected, and where the result of the subtracting will be close to zero. The threshold may be set to be close to zero, for example a near-zero positive threshold or a near-zero negative threshold.

The optimal value of the threshold may be selected depending on how noisy the sensors and environment are and the lower threshold of magnitude of detection required. Setting it too high will prevent the gradiometer detecting small (in magnetic terms) ferromagnetic target objects passing through the protected zone.

The signal processing circuit may apply the following logic, where the signal processing circuit is configured to apply the following logic, where L denotes the intermediate signal from one sensor that is larger in magnitude than the intermediate signal denoted by S from the other sensor

|  |  | Target nearer Sensor S1 |  |  |  | Target nearer Sensor S2 |  |  |  |
|---|---|---|---|---|---|---|---|---|---|
| Input signals | ΔB1 | +L | +L | −L | −L | +S | +S | −S | −S |
| L = Large, S = small | ΔB2 | +S | −S | +S | −S | +L | −L | +L | −L |
| Directional Gradiometer | |ΔB1| − |ΔB2| | L − S | L − S | L − S | L − S | S − L | S − L | S − L | S − L |
|  | Sign | +ve | +ve | +ve | +ve | −ve | −ve | −ve | −ve |
|  | Output (detector threshold = 0) | 1 | 1 | 1 | 1 | 0 | 0 | 0 | 0 |

In the table set out above, ΔB1 is the signal from sensor S1, filtered using a high pass and/or low pass filter so as to only represent the value of the magnetic field associated with the moving target object, and ΔB2 is the signal from sensor S2, filtered using a high pass and/or low pass filter so as to only represent the value of the magnetic field associated with the moving target object, wherein the intermediate signals |ΔB1| and |ΔB2| are the absolute values of ΔB1 and ΔB2

Each magnetic sensor may produce a raw measurement signal that has a value dependent on both the static field associated with non-moving objects and the Earth's magnetic field as well as a component associated with the moving target object and, to produce the measurements signals, the apparatus may additionally comprise a high pass filter, the raw measurement signals output from each magnetic sensor, or a signal derived therefrom, being passed through the high pass filter to provide a signal having both an amplitude and sign. This may then be further processed to remove the sign of the measurement signal to leave only the magnitude, i.e., the required absolute value.

The signal processing means may include a respective full wave rectifier for each magnetic sensor, which receives the raw output at an input and provides the (magnitude only) measurement signal as an output.

This removes any large ambient background signals from the two measurement signals, leaving only the magnitude of the signal associated with a localized object ΔB1 and ΔB2.

The high pass filter may have a corner frequency of around 0.05 to 0.2 Hz, which has been found to provide a corner frequency below any movement associated with a person walking into or out of the protected area who may be carrying a ferromagnetic object.

The apparatus may additionally include a low pass filter, the measurement signal output from each magnetic sensor or a signal derived therefrom being passed through the low pass filter.

The measurement signals may pass through the low pass filter prior to passing to the signal processing circuit, or within the signal processing circuit. This removes any large ambient background signals from the two measurement signals, leaving only the signal associated with a localized object.

The low pass filter may have a corner frequency of around 3 to 10 Hz providing an upper limit to the bandwidth of the apparatus. This filtering helps reduce any noise that may otherwise be present in the output of the apparatus.

Of course, if preferred, a band pass filter may be used instead of a low and high pass filter.

The signal processing means may comprise an analogue circuit, or a digital circuit, or a combination of analogue and digital circuitry.

It is preferable that the measurement signals from the magnetic sensors are digitised and all the subsequent processing steps to form the directional gradiometer are conducted in a software programme within a processor which forms the signal processing circuit.

The signals from the sensors may be processed in different ways to access additional information about the target. One way is to use this apparatus to simultaneously compute the directional gradiometer of this invention together with the conventional magnetic gradient signal The signal processing circuit, or an additional signal processing circuit, may therefore further be configured to process the measurement signals from each of the two magnetic sensors in the manner of a conventional magnetic gradiometer to produce a second output signal.

To function in the manner of a conventional gradiometer the signal processing circuit may subtract one measurement signal from the other to produce the second output signal or a signal which forms a basis of the second output signal.

The apparatus may be arranged to process both output signals to determine one or more properties of the target entering the protected Zone.

The additional information from the conventional gradiometer indicates the approximate orientation of the magnetism in the target. Further computation can use this to infer as an additional property of the target the distance that the target has passed from the sensors.

Furthermore, where there are two or more directional apparatus of this invention, the individual sensors can be combined in many alternative ways that aid the goal of understanding the behaviour of a target passing into a protected zone and discriminating between that and unwanted external influences.

A further advantage of digital processing is the ability to record the time evolution of the processed signals and make further deductions about the nature, speed and track of the targets passing into the protected zone. This may aid, for example, discrimination about the nature or severity of potential hazards and issue corresponding warnings.

The apparatus may therefore include a clock or timer which produces a time signal and the signal processing means may be arranged to record a data set of historical samples of the or each of the output signals and/or the measurement signals along with the time at which the samples were generated, the signal processing means being arranged to use the historical samples to determine one or more properties of the target entering the protected Zone. The additional property may include information about direction of movement of the target.

The apparatus of the first aspect may be considered to be a form of unidirectional gradiometer, in so far as it functions in a similar manner to a conventional gradiometer but has an ability to be sensitive to targets in a single direction whereas a conventional gradiometer has no ability to discern the direction to a target.

According to a second aspect the invention provides system for protecting a protected area, the apparatus comprising:

a first apparatus according to the first aspect of the invention located on a first side of the area to the protected oriented such that the protected zone of the apparatus encompasses the whole of the protected area, and a warning device operable in response to the issues of the alert signal from the signal processing circuit.

The warning device may comprise at least one of a visual, audible, or physical warning or impediment.

The warning device may be at the door to warn the person passing into the protected zone or it may be remote, say in a control room, or both.

The warning device where provided may be remote from the apparatus.

The system of the second aspect will only be sensitive to moving magnetic objects on the doorway side of the system, and will not issue false alarms if a magnetic object is moving on the side of the apparatus that faces away from the doorway.

In a refinement, the system of the second aspect may further comprise a second magnetic apparatus according to the first aspect of the invention located on a second, opposing, side of the protected area oriented such that the protected zone of the system encompasses the whole of the protected area and thereby overlaps the protected area of the first apparatus, the apparatus further comprising a further signal processing means, which combines the output signals from the two magnetic apparatus to produce the alert signal that is passed to the alarm.

The further signal processing means may look for a correlation between the two apparatus and issue an alert only in the case that both apparatus have detected an object. This may be achieved by combining the output of the two apparatus using a logical AND function. The further signal processing means may comprise a logical AND function.

The further signal processing means may be implemented as an analogue or a digital circuit, or as a mix of analogue and digital circuits.

The two apparatus may be arranged so that the baselines along which the two magnetic detectors of each apparatus are aligned are along a common axis that extends from one side of the protected area to the other.

The two apparatus may be located, in use, on the left and right sides of a door way, respectively, the protected area thereby extending across the opening of the doorway.

In an alternative, the two baselines may be orientated so that they do not share a common axis such that the protected zones for each of the two magnetic apparatus only partially overlap, defining the protected area.

Where the baselines are offset, the further signal processing means may be configured to determine, from the order in which each apparatus output signal changes, the direction from which the moving target object has entered the protected areas. This is possible because one apparatus will detect the object before the other and before it enters the overlapping region defining the protected area.

This can be used to good effect to protect a doorway with the protected zone of one apparatus extending across a region entirely on one side of a doorway and the protected zone of the other apparatus extending through to the other side of the doorway.

Although this arrangement of two magnetic detection apparatus (of the first aspect) will determine whether there is a ferrous target object moving between the two only partially overlapping protected zones, it does not distinguish whether the object is passing through the doorway or parallel to it. To resolve this, the system of the second aspect of the invention may further comprise a third sensor, which is non-magnetic and which has a zone of detection that extends only along a narrow region spanning from one side of the protected area to the other.

This narrow region may correspond to the threshold of the door, although it may encompass a region at floor level or at some height above floor level.

A suitable third sensor may comprise an optical sensor fixed relative to one side of the door that detects light from a light source on the other side of the door or reflected from a reflector located at the other side of the door.

The third sensor may be configured to generate a measurement signal having a digital output that is 1, high, when the protected door is being passed through and 0, low, otherwise.

The further signal processing circuit may be arranged to receive the output signal from the third sensor and feed this into the same logical AND function that processes the signals output from the first and second magnetic sensors to configure a complete system whereby only a ferromagnetic object entering a door will cause an alert. The non-magnetic sensor means may also detect the direction of travel through the entryway and output a logical 1 for one direction of travel and output 0 for the other. It is clear that, to provide an indication of directionality, more than one non-magnetic sensor may be required.

The protected area may comprise an MRI room, the door being an entrance/exit to/from the room, a door leading to the MRI area or an entrance to a secured room.

BRIEF DESCRIPTION OF THE DRAWINGS

There will now be described by way of example only, several embodiments. The embodiments are described with reference to the accompanying drawings, in which.

DETAILED DESCRIPTION

Figure 1:
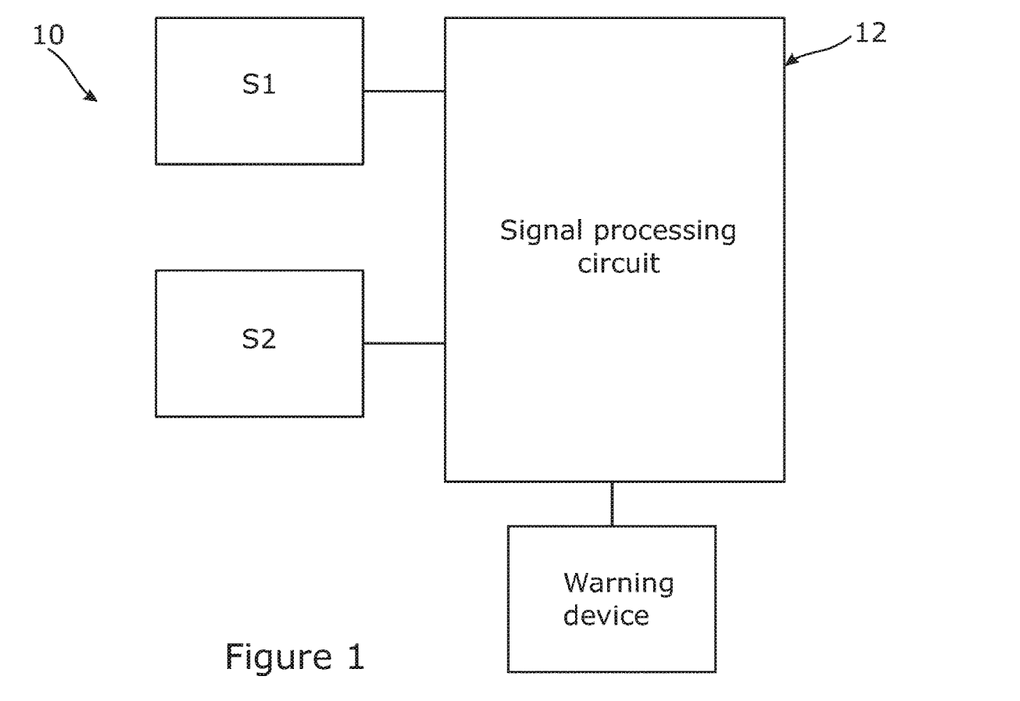
FIG. 1 is a schematic representation of an embodiment of an apparatus in accordance with a first aspect of the invention.

Referring to FIG. 1, the main function components of an embodiment of an apparatus 10 in accordance with an aspect of the invention is shown.

The apparatus 10 comprises two vector type magnetic sensors S1, S2. Each one is adapted to measure an ambient magnetic field within a localised volume of space defined by a respective first or second zone of sensitivity of the magnetic sensor S1, S2, and to produce a corresponding measurement signal indicative of the absolute value of the magnetic field in the respective first or second zone.

The two magnetic sensors S1, S2 are separated spatially by a small distance, typically up to 20 cm or 30 cm or thereabouts along a baseline, both typically being located within a common housing (not shown). Each magnetic sensor S1, S2, being omnidirectional, will define a ellipsoidal zone of detection with the magnetic sensor S1, S2 at the centre of the ellipsoid. Because of the small offset along the baseline relative to the diameter of the two ellipsoids, the zones of the two magnetic sensors S1, S2 will overlap. This overlap will, due to the way the apparatus of the invention processes the signals, define two different zones: a protected zone and a non-protected zone.

Figure 3:
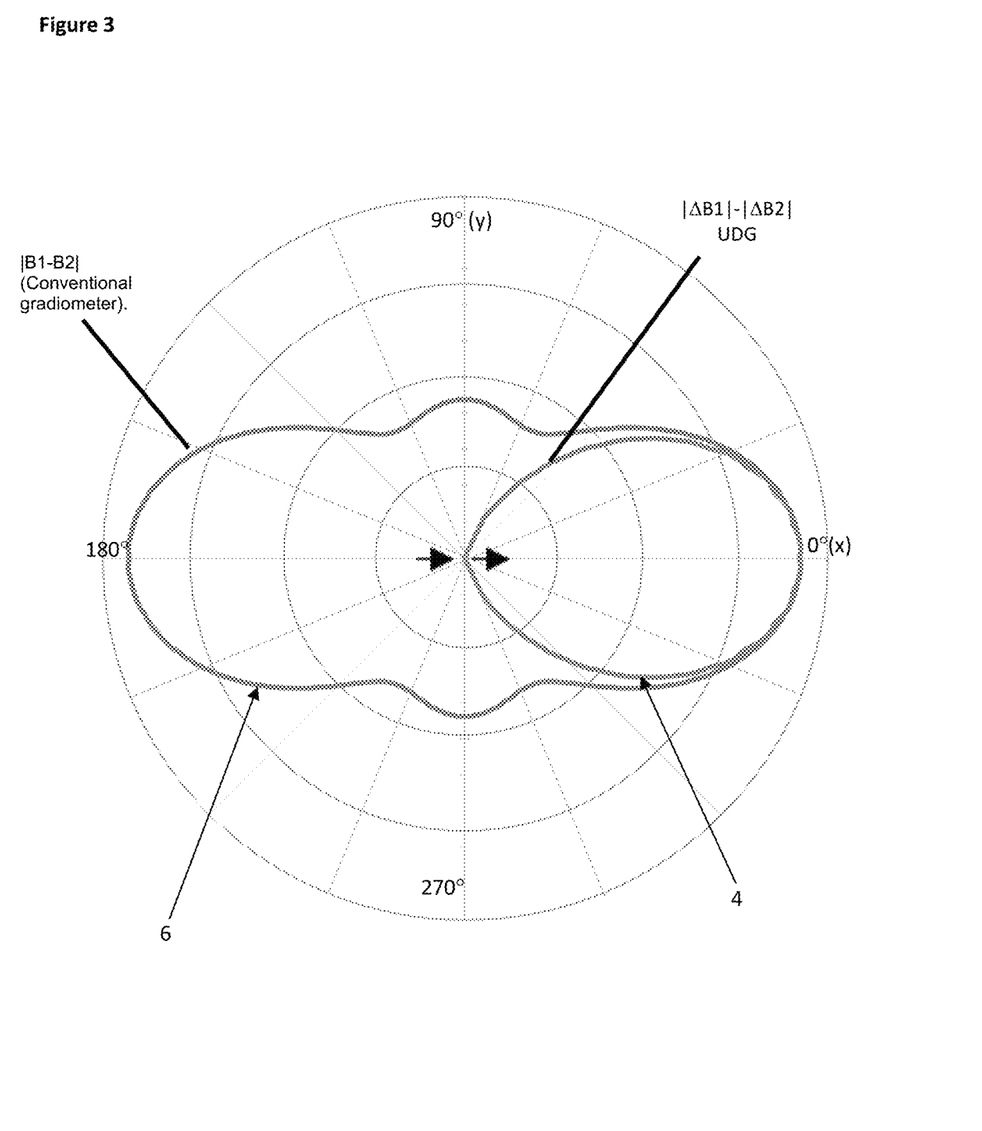
FIG. 3 is a polar plot of the output signal obtained from the apparatus of FIG. 1 and a corresponding plot for an arrangement of a conventional non-directional prior art gradiometer using the same dipole and magnetic detectors. Here the radial distance from the origin is the magnitude of the output for each angle surrounding the gradiometer that is represented by the two arrows near the centre.

The protected zone 4 can be seen in FIG. 3 for an example with the following conditions:

the apparatus 10 comprises two magnetic sensors S1, S2 arranged on the x-axis and separated by a 20 cm baseline;
the dipole is 1 mA·m$^2$;
sensors are scaled at 50 µT/V (no gain);
graph full scale is +/−10$^{-6}$ V in X; and
threshold for detection is 10$^{-7}$ V.

Also shown in FIG. 3 is the zone of detection 6 of a conventional gradiometer, which clearly does not provide any degree of directionality. Note that FIG. 3 is a two dimensional representation of 3 dimensional shapes. The zones of detection shown have rotational symmetry around the 0° axis.

The apparatus 10 also includes a signal processing circuit 12 arranged in communication with the two magnetic sensors S1, S2. The signal processing circuit 12 is configured to perform the following:

a) process each of the two measurement signals to produce a respective first and second intermediate signal which are each independent of the value of any non-changing background magnetic field that may be present in the protected zone, the value of each for the intermediate signals thereby being dependent on the magnetic field associated with the moving target object located in the protected zone; and b) process the two intermediate signals to provide a final output signal that has a value which is indicative of whether the target object that caused the magnetic field is in the protected zone on in the non-protected zone.

Figure 2:
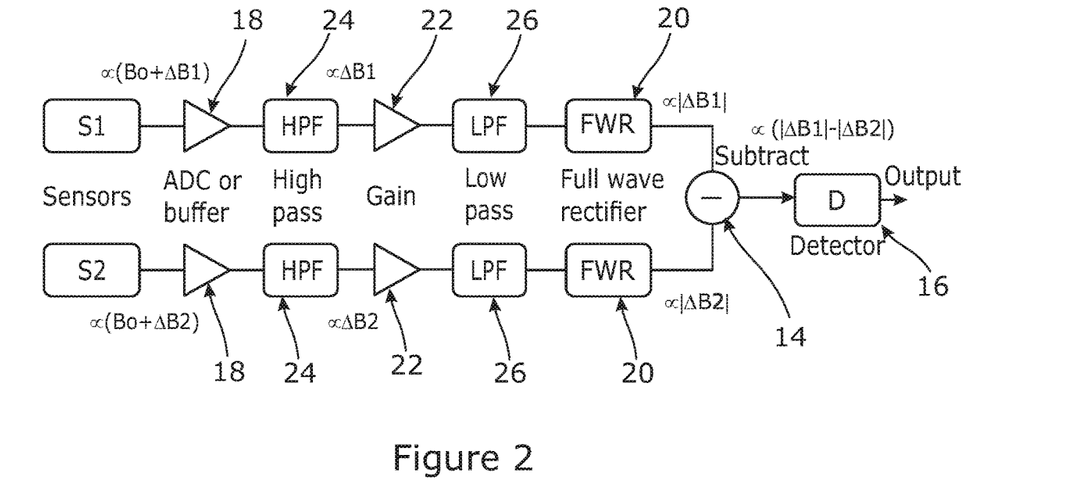
FIG. 2 is a block diagram showing the main functional processing blocks of the apparatus of FIG. 1.

FIG. 2 is a block diagram which shows the various parts of the apparatus that may be employed to achieve the required functionality. The apparatus essentially comprises two parallel processing lines, one for S1 and the other for S2, at the end of each line are the intermediate signals, (|ΔB1|, |ΔB2|), which the signal produced from the second line is subtracted from the signal produced from the first line by feeding them both to the input of a subtractor 14. The output of the subtractor 14 is then passed through a thresholder 16 to provide a binary output having a first logical value if the object is in the protected zone and a second logical value if is outside of that zone.

Each line comprises the following components arranged in series: an amplifier 18 (optional); a full wave rectifier 20, a further amplifier 22 (optional), a high pass filter 24 and a low pass filter 26 (the order can be reversed or a band pass filter used).

It is known that it takes between 0.3 seconds and 3 seconds, typically, for a person to pass through a doorway. The reciprocal of these times defines the frequencies of interest in the output of the sensor 4, i.e. 0.3 to 3 Hz. The high pass filter 24 of each line may therefore conveniently be set to a value of, say, 0.2 Hz and the low pass filter 26 to a value of, say, 3-10 Hz.

It should be noted that it is desirable for the properties of the two lines to match to a high degree and this is best achieved in a digital processing regime. The amplifiers 18 may include analogue to digital converters, and the following functions bay be implemented in a digital processor, ensuring identical properties of the two lines.

Figure 4:
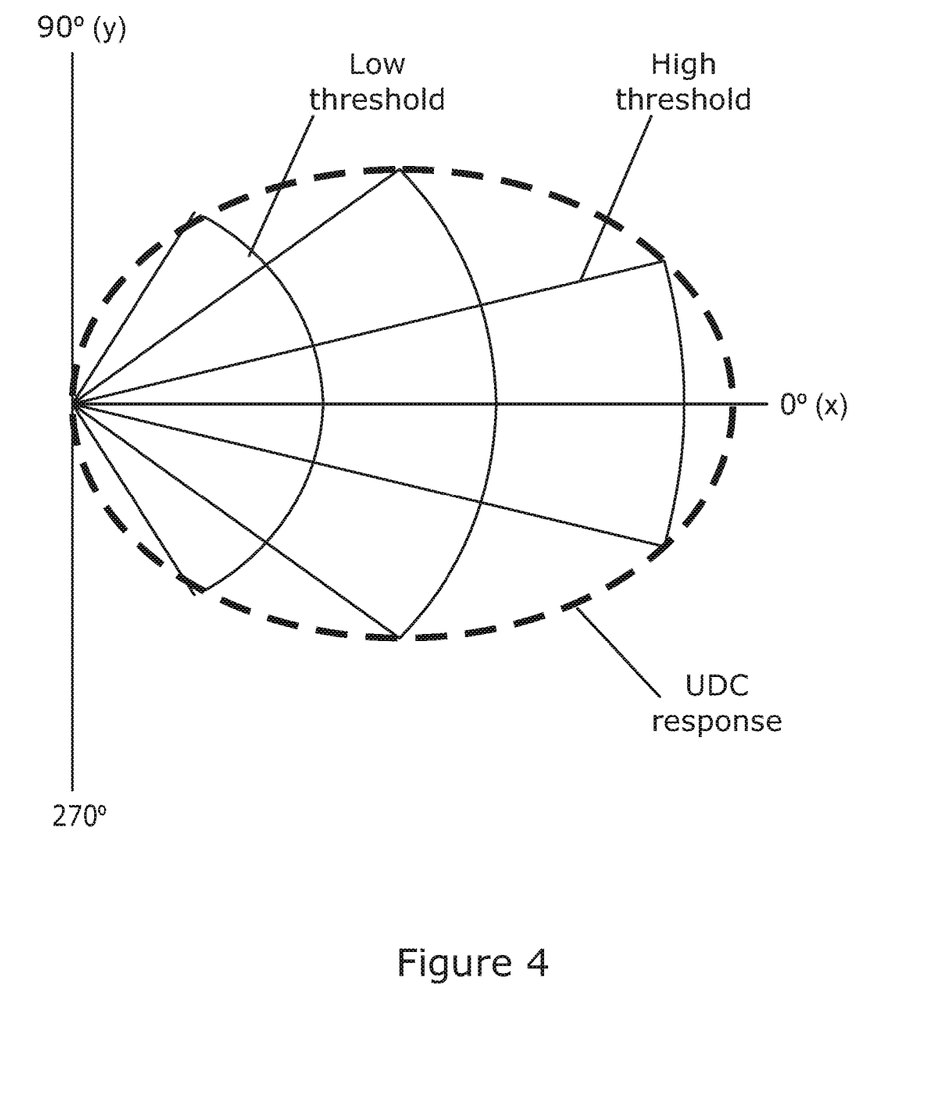
FIG. 4 is a plot showing the effect of varying the detection threshold on the directionality of the apparatus of FIG. 1.

The effect of using higher threshold values is shown in FIG. 4. For a given target size the detection volume becomes more focused in the direction of the baseline as the threshold increases. From FIG. 4, it can be seen that a low detection threshold value has the widest detection angle, and the highest threshold has a narrow detection angle. The detector threshold can be represented in FIG. 4 by a circle around the origin with a radius equal to the threshold value. The detection angle is the angle between the two points of intersection between the circle and the directional apparatus's response (the same as in FIG. 3) and the origin.

The apparatus 10 can be used in a range of applications, but it is in particular envisaged that it may be used to form an apparatus for use in protecting an entrance to a protected area is shown. For the purpose of this example, the protected area is a room outside of but leading to an MRI room typically called the MR Controlled Access Area (U.K.) or Zone III (USA). The apparatus protects the doorway of the room by operating a warning device, in appropriate circumstances, if it detects that a ferromagnetic object is passing or about to pass through the doorway. The warning device may be a sound, an intermittent sound or a voice informing the occupants of the protected area that a ferromagnetic object has entered. The warning device may be integrated with the apparatus or may alternatively be remote, such as a desk-top box in a control room. The warning device may be connected to the apparatus by wire, or by a wireless link such as RF, infrared, or ultrasonic means. Additionally, several such apparatus may be integrated with a warning device or a display in a either in a control room or on a portable or hand-held device such as a phone or tablet. This would be particularly useful where the apparatus are employed as a security measure at several entrances to a building, or at a substantial entrance with many doors.

Figure 5A:
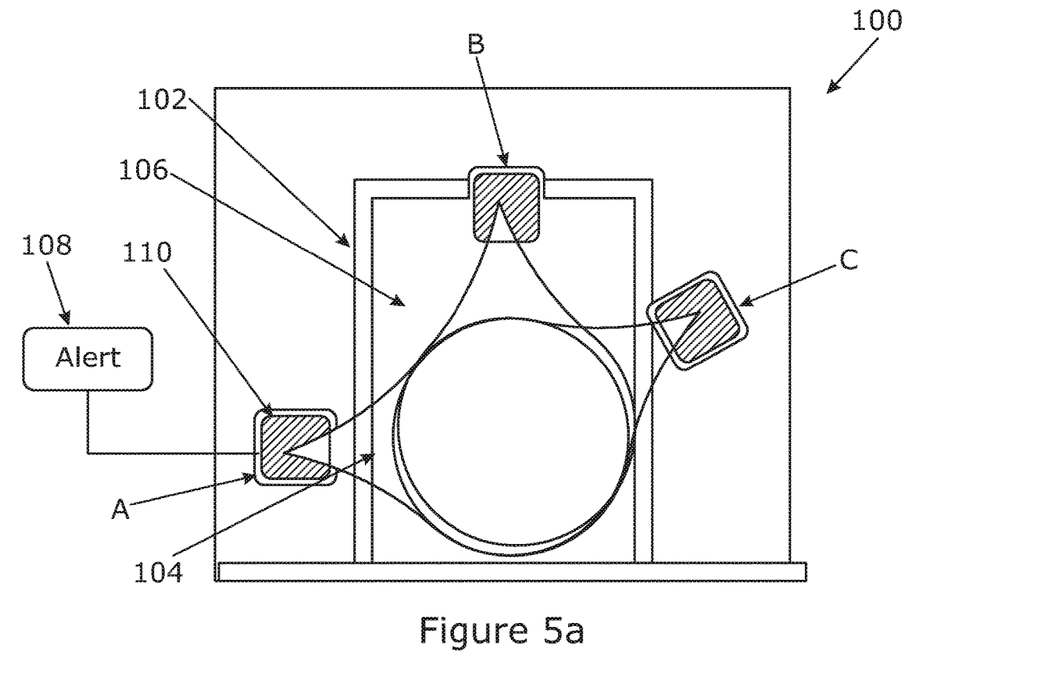
FIG. 5a is an illustration of the apparatus of FIG. 1 positioned to protect a doorway to an area such as one leading to an MRI room, illustrating how it can be mounted in different positions and orientations to cover the same area of the threshold.

An exemplary protection apparatus or system 100 that falls within the scope of the second aspect of the invention is shown in FIG. 5a. It comprises one apparatus 110, as shown in FIG. 1, located at a position on a doorframe 102 such that the protected zone 104 extends across the doorway 106. Three possible positions A, B, C for the apparatus are shown in FIG. 5a. In each position, a ferromagnetic target object must pass through the protected zone 104 before passing through the doorway 106, which will raise the alarm. An object moving to the side of the doorway 106 where the apparatus 110 is located will not activate the warning device 108. The positions shown are exemplary as any position may be adopted provided the orientation of the apparatus is set to protect the protected zone.

Figure 5B:
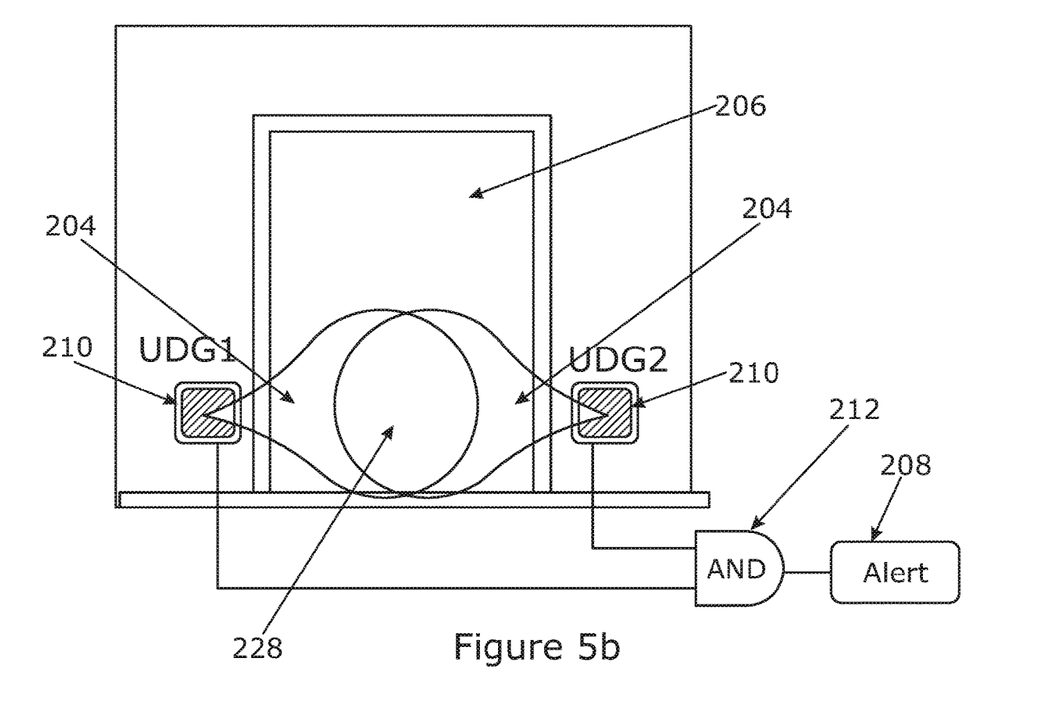
FIG. 5b is an illustration similar to FIG. 6a showing a first embodiment of a system in accordance with the second aspect of the present invention that uses two of the apparatus of the first aspect of the invention.

In a refinement shown in FIG. 5b, two apparatus 210 are used, each oriented so that their protected zone 204 extends across the doorway 206. The output from the two apparatus 210 is fed into a further signal processing means 212 that performs a logical AND function. This is then fed to the alarm circuit or warning device 208. The presence of the AND function ensures the alarm is only raised if the object is detected by both apparatus 210, e.g. the target object is passing through the doorway 206 in the protected area 228 formed by the overlap of the protected zones 204.

Other configurations are possible to provide different functionality. For example, the plan views in FIGS. 6a and 6b show two arrangements where the direction of detection of the apparatus 310, 410 may be set to achieve different sensing objectives.

Figure 6A:
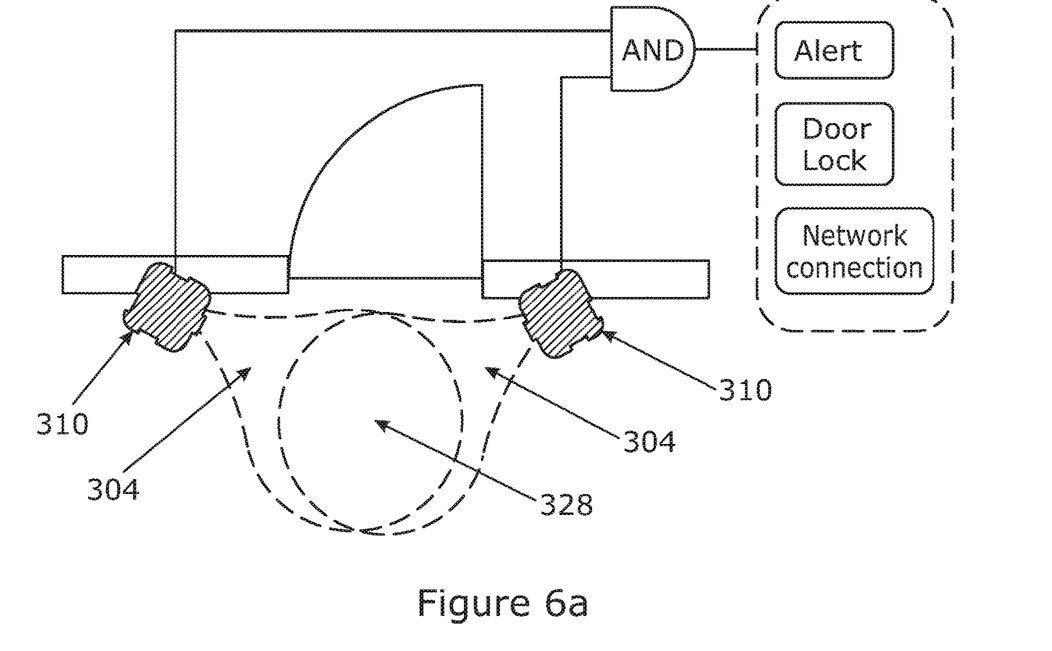
FIG. 6a is a plan view of an arrangement of the second embodiment in which the protection zone of each of the two apparatus extends on only one side of the doorway.

In FIG. 6a, the direction of the protected zone 304 of both apparatus 310 is pointing outward to cover the area immediately before the door 330, their overlap forming the protected area 328. The choice of warning device 308 may depend on the application of the apparatus. If the application is to provide an alert to a user, a visual or audible alert may be issued. If the application is as a security device, the output may operate a door lock or report to a security network. The warning device may, for example, include a light, siren, speaker, lock, or other visual, audible, or physical warning or impediment. There are several alternative uses for which the output may be used and this is not a definitive list, nor is it limited to this embodiment. The warning device may be local to, or remote from, the remainder of the apparatus, for example attached to a wall adjacent to the apparatus or in a control room separate from the apparatus.

Figure 6B:
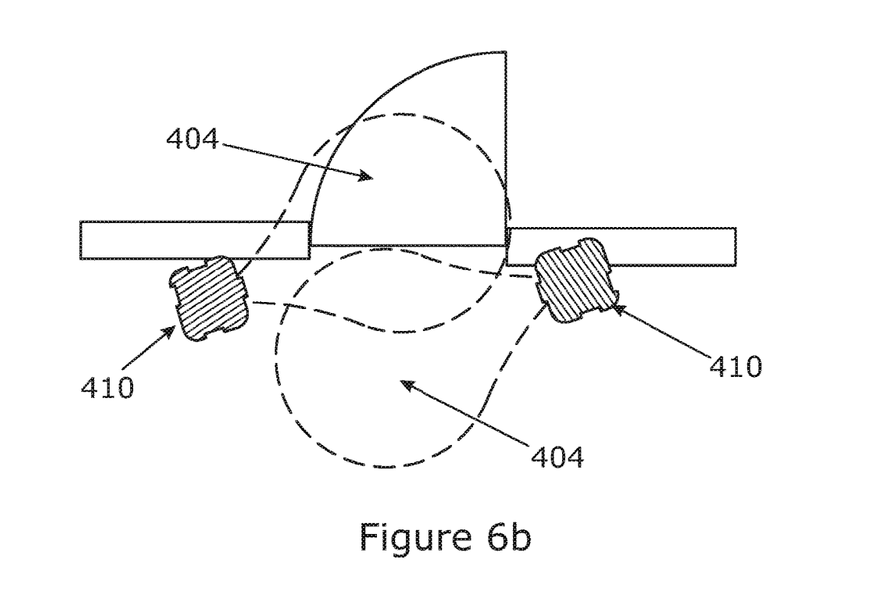
FIG. 6b is a plan view of an alternative arrangement of the second embodiment in which the two protection zones overlap but are offset with one extending through the doorway.

FIG. 6b shows another arrangement where the two apparatus 410 monitor protected zones 404. One advantage of this configuration is that if the apparatus 410 are connected to a processor the time at which magnetic activity occurs in each zone can be recorded and used. For example, if the time order of magnetic activity in the respective protected zones 404 is determined, the direction of travel may be determined without the need for secondary non-magnetic sensors.

Figure 7:
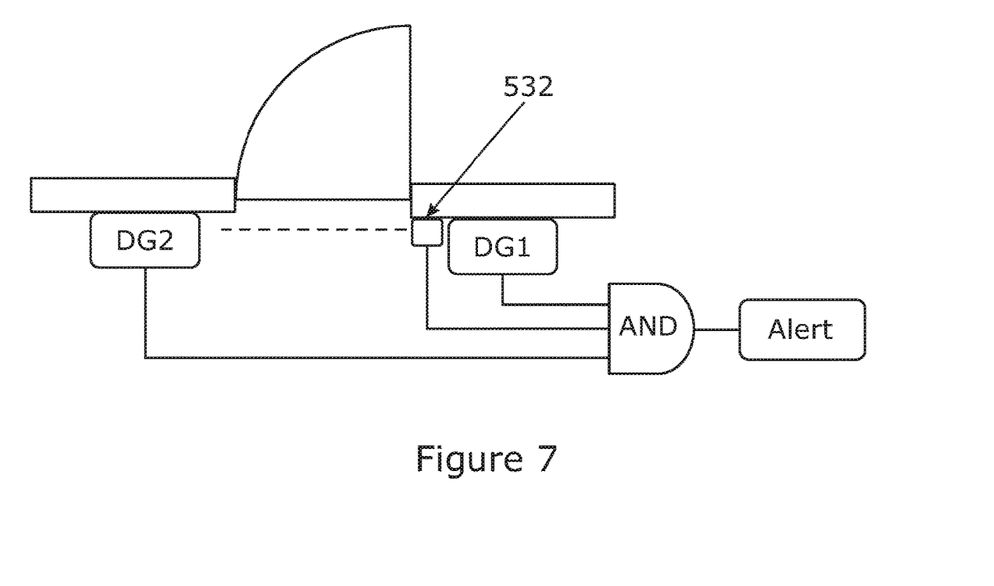
FIG. 7 is a plan view of a third embodiment of a protection apparatus that includes an additional, third, non-magnetic sensor.

In another arrangement shown in FIG. 7, an embodiment of a protection apparatus is shown having all the features of the embodiment of FIG. 5a or FIG. 5b but also including a third, non-magnetic sensor 532. This sensor 532, which may be an optical detector that detects the breaking of a beam of light passing across the door from side-to-side, is used to detect whether the door threshold 534 has been passed. The output of the third sensor 532 may have a digital output that is 1 (high) when the door threshold 534 is being passed through and 0 (low) otherwise. This can then be input to the same AND logic to configure a complete system whereby only a ferromagnetic object entering the doorway 506 will cause an alert.

The non-magnetic sensor 532 may also detect the direction of travel through the doorway or entryway and output a logical 1 for one direction of travel and output 0 for the other. It is clear that to provide an indication of directionality more than one non-magnetic sensor 532 may be required, for instance two beams that are arranged in parallel from one side of the door to the other so that an object passing through the doorway will break one beam before the other in a first direction and the opposite when moving in the opposite direction.

Figure 8:
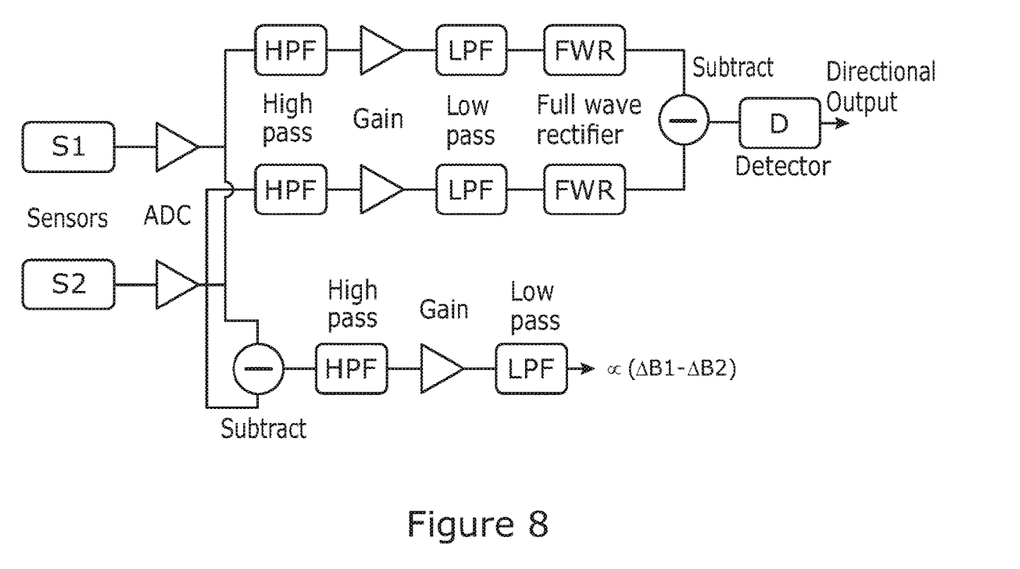
FIG. 8 is a functional process diagram of an embodiment of an apparatus in accordance with a first aspect of the invention where the functional processes for additionally configuring as a conventional magnetic gradiometer are configured to operate simultaneously and in parallel.

FIG. 8 is a functional process diagram of a further embodiment of an apparatus in accordance with a first aspect of the invention where the functional processes for additionally configuring as a conventional magnetic gradiometer are configured to operate simultaneously and in parallel. As can be seen, all of the functional elements of the first embodiment are present, but in addition the measurement signals from the two sensors are combined by subtracting one from the other to provide a further intermediate signal which is then passed through suitable signal conditioning (a high pass filter, amplifier and final low pass filter) to produce a second output signal.

The two output signals produced in this embodiment may be processed together to provide further information about the target that has been detected. The unidirectional magnetic apparatus output will indicate if it is in a protected zone or not. The conventional signal may then be used with this to determine the approximate orientation.

The invention claimed is:

1. An apparatus for detecting a moving ferromagnetic target object in a protected zone, the apparatus comprising:
   a first magnetic sensor adapted to measure a magnetic field within a first localised volume of space defined by a first zone of sensitivity of the first magnetic sensor, and to produce a corresponding first measurement signal;
   a second magnetic sensor adapted to measure a magnetic field within a second localised volume of space defined by a second zone of sensitivity of the second magnetic sensor, and to produce a corresponding second measurement signal;
   the first magnetic sensor and second magnetic sensor are separated spatially by a baseline such that the overlap between the two zones of sensitivity defines both a protected zone and a non-protected zone; and
   a signal processing circuit arranged in communication with the two magnetic sensors;
   in which the signal processing circuit is configured to:
   a) process each of the first and second measurements signals to produce a respective first intermediate signal and second intermediate signal which are each independent of the value of any non-changing background magnetic field that may be present in each zone of sensitivity, the value of the first and second intermediate signals thereby being dependent on the magnetic field associated with a target object moving in each zone of sensitivity, the first and second intermediate signals being proportional to the absolute change in magnetic field generated by the movement of the target object; and
   b) process the two intermediate signals to provide an output signal that has a value that is indicative of whether the target object that caused the magnetic field is in the protected zone or in the non-protected zone, wherein the signal processing circuit is configured to subtract the second intermediate signal from the first intermediate signal.

2. The apparatus according to claim 1, wherein the first and second magnetic sensors comprise a vector-type magnetic sensor.

3. The apparatus according to claim 1, wherein the first and second magnetic sensors each comprise one of the following: a fluxgate sensor, a magneto-resistive sensor, a magneto-impedance sensor, a Hall Effect sensor, or galvanic coil sensor, or a total-field magnetometer which outputs a raw signal that is a measurement of the magnetic field incident upon the sensor.

4. The apparatus according to claim 1, wherein the signal processing means is arranged to indicate that the target object is in the protected zone or the non-protected zone according to the sign of the output signal.

5. The apparatus according to claim 1, wherein the signal processing circuit includes a threshold detector, the output signal that results from the subtraction being passed through the threshold detector to provide a thresholded output signal that has two logical states, the state determining if the target object is in the protected zone or outside of the protected zone, the logical state depending on whether the value that results from the subtraction exceeds the threshold or not.

6. The apparatus according to claim 5, wherein the threshold is set to be close to zero.

7. The apparatus according to claim 1, wherein each magnetic sensor is configured to produce a raw measurement signal that has a value dependent on both the static field associated with non-moving objects and the Earth's magnetic field as well as a component associated with the moving target object, wherein, to produce the measurement signals, the apparatus further comprises a high pass filter, the raw measurement signals output from each magnetic sensor, or a signal derived therefrom, being passed through the high pass filter to provide a signal having both an amplitude and sign.

8. The apparatus according to claim 7, wherein the signal processing means is further configured to remove the signs of the measurement signals to leave only the magnitude.

9. The apparatus according to claim 8, wherein the signal processing means includes a respective full wave rectifier, a sign remover or a modulus operation for each magnetic sensor, which receives the raw output at an input and provides the measurement signal as an output.

10. The apparatus according to claim 1 in which the signal processing circuit, or an additional signal processing circuit, is configured to process the measurement signals from each of the two magnetic sensors in the manner of a conventional magnetic gradiometer to produce a second output signal by subtracting one measurement signal from the other to produce the second output signal or a signal which forms a basis of the second output signal.

11. The apparatus according to claim 10 arranged to process both output signals to determine one or more properties of the target entering the protected Zone.

12. The apparatus according to claim 11 in which the additional information from the conventional gradiometer is processed with the first output signal to provide an indication the approximate orientation of the magnetism in the target.

13. A system for protecting a protected area, the system comprising:

a first magnetic apparatus according to claim 1 located on a first side of the area to the protected oriented such that the protected zone of the apparatus encompasses the whole of the protected area; and a warning device operable in response to the issues of the alert signal from the signal processing circuit.

14. The system according to claim 13, wherein the warning device comprises at least one of a visual, audible, or physical warning or impediment.

15. The system according to claim 14, further comprising a second magnetic apparatus according to claim 1 located on a second, opposing, side of the protected area oriented such that the protected zone of the apparatus encompasses the whole of the protected area and thereby overlaps the protected area of the first apparatus, the apparatus further comprising a further signal processing means, which combines the output signals from the two magnetic apparatus to produce the alert signal that is passed to the alarm.

16. The system according to claim 15, wherein the further signal processing means is configured to combine the output of the two apparatus using a logical AND function, a sign remover, or a modulus operation.

17. The system according to claim 16, wherein the further signal processing means is configured to determine, from the order in which each apparatus output signal changes, the direction from which the moving target object has entered the protected area.

18. The system according to claim 17, wherein the two apparatus are arranged such that the baselines along which the two magnetic detectors of each apparatus are aligned are along a common axis that extends from one side of the protected area to the other.

19. The system according to claim 17, wherein the two apparatus are orientated so that they do not share a common axis such that the protected zones for each apparatus only partially overlap, defining the protected area.

20. The system according to claim 19 further comprising a third sensor, which is non-magnetic and which has a zone of detection that extends only along a narrow region spanning from one side of the protected area to the other.

21. The system according to claim 20, wherein the third sensor comprises an optical sensor fixed relative to one side of the door that detects light from a light source on the other side of the door or reflected from a reflector located at the other side of the door.

22. The system according to claim 21, wherein the further signal processing circuit is arranged to receive the output signal from the third sensor and feed this into the same logical AND function that processes the signals output from the first and second magnetic sensors to configure a complete system whereby only a ferromagnetic object entering a door will cause an alert.

\* \* \* \* \*